United States Patent
Lai et al.

(10) Patent No.: US 7,291,870 B2
(45) Date of Patent: Nov. 6, 2007

(54) ELECTROSTATIC PROTECTION CIRCUIT

(75) Inventors: Chun-Hsiang Lai, Hsinchu (TW); Shin Su, Hsinchu (TW); Chia-Ling Lu, Hsinchu (TW); Yen-Hung Yeh, Hsinchu (TW); Tao-Cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 238 days.

(21) Appl. No.: 10/904,475

(22) Filed: Nov. 12, 2004

(65) Prior Publication Data

US 2005/0269641 A1 Dec. 8, 2005

(30) Foreign Application Priority Data

Jun. 4, 2004 (TW) .............................. 93116074 A

(51) Int. Cl.
*H01L 29/72* (2006.01)
(52) U.S. Cl. ...................... 257/173; 257/328
(58) Field of Classification Search ................ 257/173, 257/328; 438/212, 268
See application file for complete search history.

(56) References Cited

U.S. PATENT DOCUMENTS

| | | | |
|---|---|---|---|
| 6,268,639 B1 * | 7/2001 | Li et al. | 257/577 |
| 7,034,363 B2 * | 4/2006 | Chen | 257/355 |
| 2005/0173727 A1 * | 8/2005 | Manna et al. | 257/173 |

* cited by examiner

*Primary Examiner*—Douglas W. Owens
(74) *Attorney, Agent, or Firm*—Jianq Chyun IP Office

(57) ABSTRACT

An electrostatic discharge (ESD) protection circuit coupled to an input pad comprises a diode formed in a substrate and coupled to the input pad; a P deep well formed in the substrate; an N well formed in the P deep well; a first P+ doped region in the N well; and an NMOS transistor formed on the substrate, comprising a gate, a source and a drain, wherein the drain is formed in the N well and coupled to a Vcc, and the source is formed in the P deep well; and a second P+ doped region formed in the P deep well. The ESD protection circuit uses a smaller area than the conventional ESD protection circuit.

9 Claims, 5 Drawing Sheets

ELECTROSTATIC PROTECTION CIRCUIT

CROSS-REFERENCE TO RELATED APPLICATION

This application claims the priority benefit of Taiwan application serial no. 93116074, filed Jun. 4, 2004.

BACKGROUND OF THE INVENTION

1. Field of the Invention

The present invention generally relates to an electrostatic discharge (ESD) protection circuit. More particularly, the present invention relates to an ESD protection circuit adapted for high-speed input pads.

2. Description of Related Art

Electrostatic discharge is a phenomenon of releasing electrostatic charges from non-conductive objects. The phenomenon causes damage to devices and circuits in integrated circuits. For example, a person walking over a carpet can generate electrostatic charges of hundreds or thousands of voltage under high humid environment. Under dry environment, electrostatic charge of more than ten thousand voltages is generated. In packaging or testing machines, static charge of hundreds or thousands of voltages is generated as well. When objects like human bodies or machines are in contact chips of integrated circuits, electrostatic charge is discharged into the chips. The electrostatic discharge pulse can damage the integrated circuits of the chips.

In order to prevent damage caused by electrostatic discharge, electrostatic discharge (ESD) protection circuits are designed and applied to integrated circuits. There are a variety of traditional designs of the ESD protection circuits. One of them is the application of MOS transistors. Although the ESD protection circuit with MOS transistors is capable of discharging electrostatic charges, it needs a larger area and therefore occupies larger space. The larger circuit area of the traditional ESD protection device obviously result in loading effect due to parasitic capacitance. As a result, signal transmission speed is adversely affected. For the devices requiring high-speed or high-voltage input, the loading effect has to be suppressed.

Another prior art ESD protection circuit includes diodes and MOS transistors in the circuit design. Generally, diodes have excellent electrical conduction efficiency. Although the diodes are capable of resolving the loading effect caused by parasitic capacitance, diodes, however, cannot discharge electrostatic charges. Due to this disadvantage, the use of MOS transistors is still required. However, the use of MOS transistors in the ESD protection circuit requires a large area. When MOS transistors are designed in the ESD protection circuit, they are usually designed close to input pads. The design of the ESD protection circuit including MOS transistors is complicated and this design inevitably increase of the circuit area.

SUMMARY OF THE INVENTION

Accordingly, the present invention is directed to an electrostatic discharge (ESD) protection circuit. The ESD protection circuit occupies smaller circuit area and is capable of efficiently discharging electrostatic pulses.

The present invention is also directed to an electrostatic discharge (ESD) protection circuit suitable for high-voltage or high-speed input pads.

According to an embodiment of the present invention, the ESD protection circuit coupled to an input pad comprises a diode, a first type deep well, a second type well, a first doped region of first type, a second doped region of second type, a third doped region of second type and a fourth doped region of first type. The diode is formed in a substrate and coupled to the input pad. The first type deep well is formed in the substrate. The second type well is formed in the first type deep well. The first doped region of first type is formed in the second type well and coupled to the input pad. The second doped region of second type is formed in the second type well and coupled to a power supply voltage (Vcc). The third doped region of second type is formed in the first type deep well. The fourth doped region of first type is formed in the first type deep well.

According to another embodiment of the present invention, the ESD protection circuit coupled to an input pad comprises a diode, a first type deep well, a second type well, a first doped region of first type, a transistor and a second doped region of first type. The diode is formed in a substrate and coupled to the input pad. The first type deep well is formed in the substrate. The second type well is formed in the first type deep well. The first doped region of first type is formed in the second type well and coupled to the input pad. The transistor is formed on the substrate, wherein the transistor comprises a gate, a source and a drain, the drain is formed in the second type well and coupled to a power supply voltage (Vcc), and the source is formed in the first type deep well. The second doped region of first type is formed in the first type deep well.

According to another embodiment of the present invention, the ESD protection circuit coupled to an input pad comprises a diode, a first type deep well, a second type well, a first doped region of first type, a second doped region of second type, a transistor and a third doped region of first type. The diode is formed in a substrate and coupled to the input pad. The first type deep well is formed in the substrate. The second type well is formed in the first type deep well. The first doped region of first type is formed in the second type well and coupled to the input pad. The second doped region of second type is formed in the second type well and coupled to a power supply voltage (Vcc). The transistor is formed on the substrate, wherein the transistor comprises a gate, a source and a drain, the drain and the source are formed in the first type deep well, and the drain is coupled to the power supply voltage (Vcc). The third doped region of first type is formed in the first type deep well.

Compared to the traditional ESD protection circuit, the ESD protection circuit according to the present invention occupies smaller area. Due to smaller circuit size, the loading effect resulting from parasitic capacitance can be substantially reduced. Accordingly, the ESD protection circuit according to the present invention can be applied to devices with high-voltage or high-speed input pads.

In order to make the aforementioned and other objects, features and advantages of the present invention understandable, a preferred embodiment accompanied with figures is described in detail below.

DESCRIPTION OF EMBODIMENTS

The electrostatic discharge (ESD) protection circuit according to the present invention can be applied to devices with high-speed input pads. Compared to the traditional ESD protection circuit, the ESD protection circuit according to an embodiment of the present invention occupies smaller area. Following is a detail description of the ESD protection circuit according various embodiments of the present invention. But the present invention is not limited thereto. In the following embodiments, the first type is P type and the second type is N type. However, a person of ordinary skill in the art will understand that the first type can be N type and the second type can be P type.

Figure 1A:
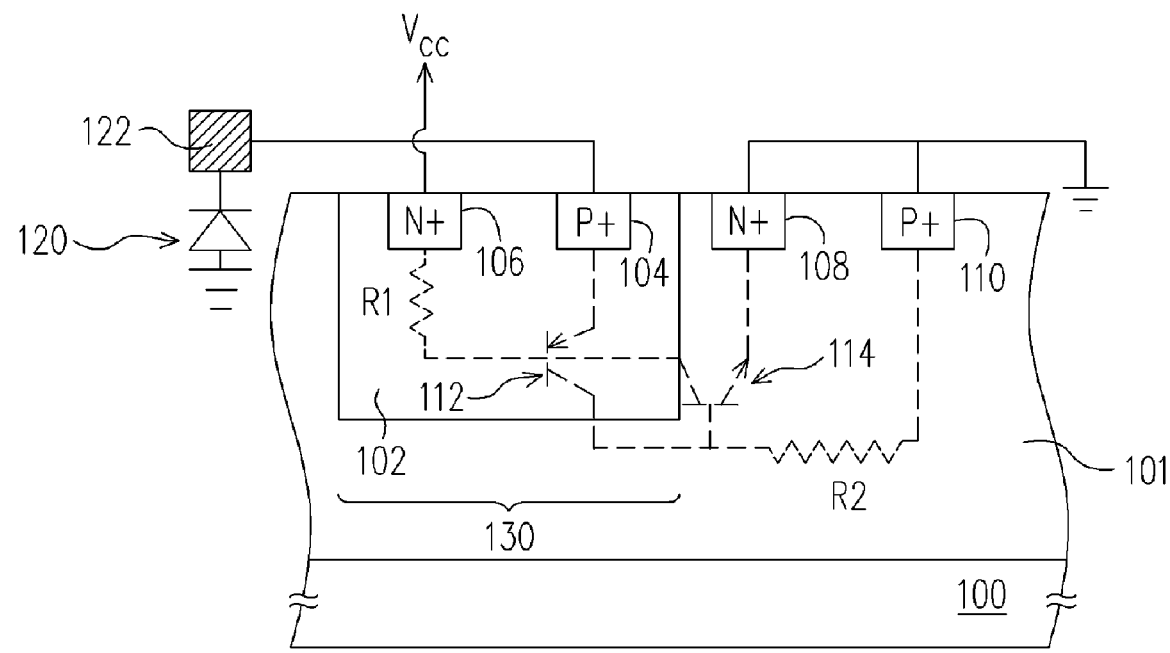
FIG. 1A is a cross-sectional schematic drawing of an ESD protection circuit according to a first embodiment of the present invention.
Figure 1B:
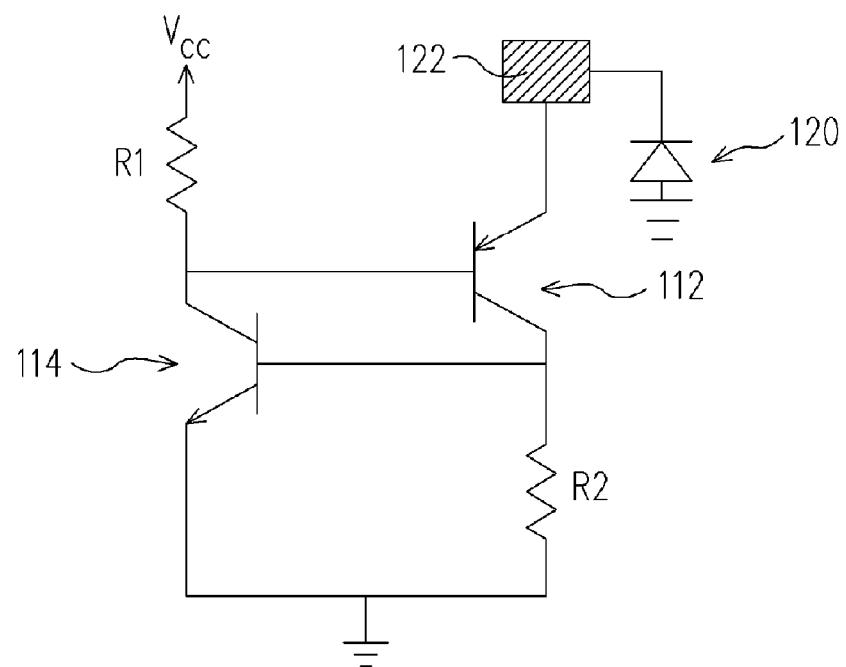
FIG. 1B is an equivalent circuit drawing related to the ESD protection circuit of FIG. 1A.

FIG. 1A is a cross-sectional schematic drawing of an ESD protection circuit according to a first embodiment of the present invention. FIG. 1B is an equivalent circuit drawing related to the ESD protection circuit of FIG. 1A. Referring to FIGS. 1A and 1B, the ESD protection circuit is coupled to an input pad 122. The ESD protection circuit comprises a diode 120, a first type deep well 101, a second type well 102, a first doped region of first type 104, a second doped region of second type 106, a third doped region of second type 108 and a fourth doped region of first type 110.

The diode 120 is formed in a substrate 100 and can be composed of, for example, an N well, a P+ doped region formed in the N well and a N+ doped region. In the present embodiment, a terminal of the diode 120 is coupled to the input pad 122 and another terminal of the diode 120 is grounded.

In the present embodiment, the first type deep well 101 can be, for example, a P deep well. The second type well 102 can be, for example, an N well. The first doped region of first type 104 can be, for example, a P+ doped region. The second doped region of second type 106 can be, for example, an N+ doped region. The third doped region of second type can be, for example, an N+ doped region. The fourth doped region of first type 110 can be, for example, a P+ doped region.

The P+ doped region 104 is formed in the N well 102. In present embodiment, the P+ doped region 104 is coupled to the input pad 122 and the N+ doped region 106 is formed in the N well 102. In the present embodiment, the N+ doped region 106 is coupled to a power supply voltage (Vcc) and the P+ doped region 110 and the N+ doped region 108 are formed in the P deep well 101. In the present embodiment, P+ doped region 110 and the N+ doped region 108 are grounded.

The N well 102, the P+ doped region 104 in the N well 102 and the N+ doped region 106 constitute a diode 130. A terminal of the diode 130 is coupled to the input pad 122 and another terminal of the diode 130 is coupled to the power supply voltage (Vcc).

When an electrostatic pulse is applied to the ESD protection circuit, the Vcc is in off-state. When the electrostatic pulse flows to the input pad 122, the ESD protection circuit is triggered. For example, when a positive electrostatic pulse flows to the input pad 122, the diode 130 discharges the positive electrostatic pulse; when a negative electrostatic pulse flows into the input pad 122, the diode 120 discharges the negative electrostatic current. According to the present embodiment of the present invention, the P+ doped region 104, the N well 102 and the P deep well 101 constitute a PNP parasitic bipolar transistor 112, wherein R1 is the resistance of the N well 102; and the N well 102, the P deep well 101 and the N+ doped region 108 constitute an NPN parasitic bipolar transistor 114, wherein R2 is the resistance of the P deep well. According to the present embodiment of the present invention, the base of the PNP parasitic bipolar transistor 112 is coupled to the collector of the NPN parasitic bipolar transistor 114 and the base of the NPN parasitic bipolar transistor 114 is coupled to the collector of the PNP parasitic bipolar transistor 112. Accordingly, the base of the parasitic bipolar transistors is triggered by the collector of other parasitic bipolar transistor, and a positive feedback loop is formed therefrom. The PNPN structure formed by the parasitic bipolar transistors is a silicon control rectifier (SCR).

According to an embodiment of the present invention, the ESD protection circuit comprising diodes 120 and 130 and SCR composed of the bipolar transistors 112 and 114 do not require MOS transistors. Therefore, the ES protection circuit of the present invention consumes smaller area.

Figure 2A:
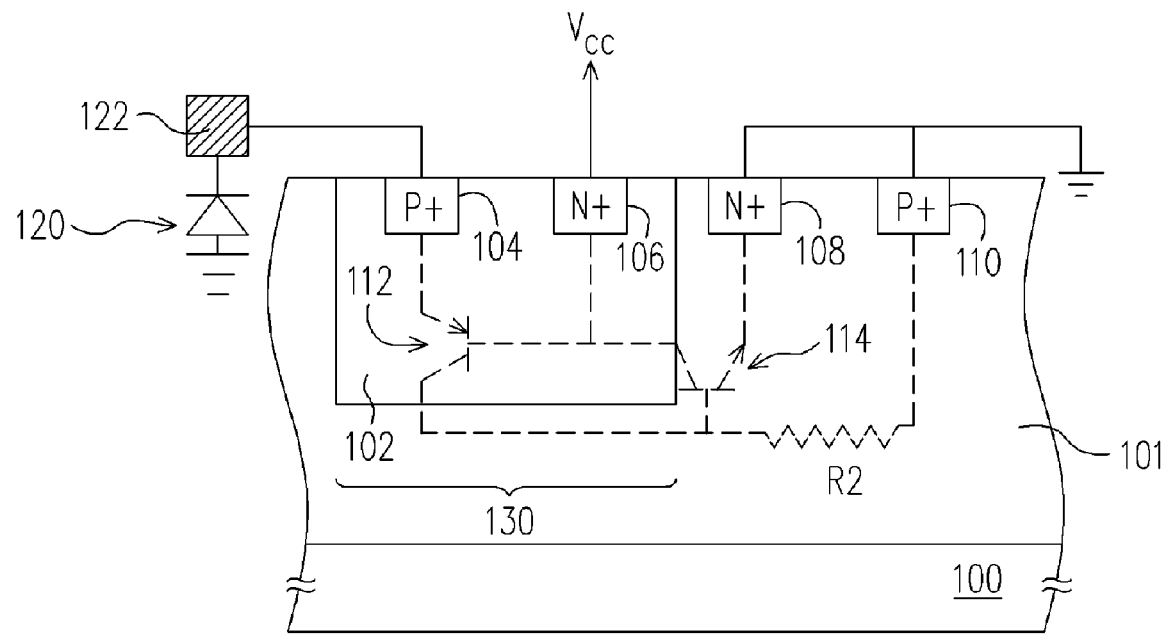
FIGS. 2A and 2B are a cross-sectional schematic drawing and an equivalent circuit thereof of an ESD protection circuit according to a second embodiment of the present invention.
Figure 2B:
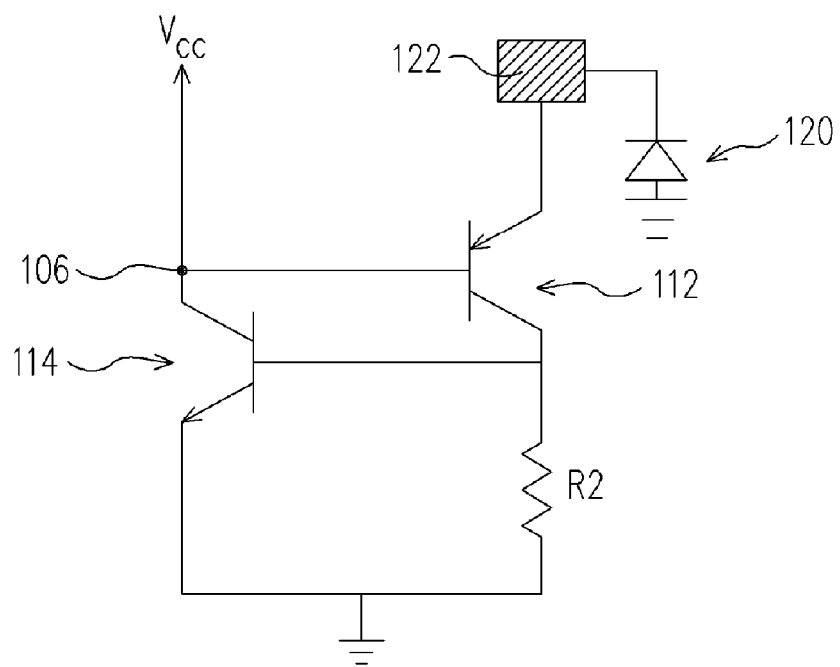

FIGS. 2A and 2B are a cross-sectional schematic drawing and an equivalent circuit thereof of an ESD protection circuit according to a second embodiment of the present invention. Referring to FIGS. 2A and 2B, the N+ doped region 106 is formed between the P+ doped region 104 and the N+ doped region 108. As a result, the N+ doped region 106 formed in the N well 102 is close to the N+ doped region 108 in the P type well 101. Part of the N+ doped region 106 of the diode 130 serves as a guard ring for the SCR.

In the present embodiment of the present invention, when the device is under normal operation, the Vcc is in on-state. The base and emitter of the PNP parasitic bipolar transistor 112 is subjected to a reversed bias so that the PNP parasitic bipolar transistor 112 is turned off. Because the PNP parasitic bipolar transistor 112 are in off-state, no positive feedback loop or SCR is formed therein. Accordingly, the ESD protection circuit of the present invention is capable of preventing the latch-up effect.

The operation of the SCR requires electrons and holes. When electrostatic pulse flows through the N+ doped region 106, electrons are attracted to the N+ doped region 106. Due to the electron attraction, the SCR cannot be turned on. Accordingly, the N+ doped region 106 serves as a guard ring for the SCR and latch-up effect can be eliminated.

When an electrostatic pulse attacks the input pad 122, the Vcc is in off-state. The circuit becomes a positive feedback loop in a manner described with reference to FIGS. 1A and 1B and the bipolar transistors 112 and 114 forms the SCR. Accordingly, the ESD protection circuit is capable of discharging electrostatic pulse.

Figure 3:
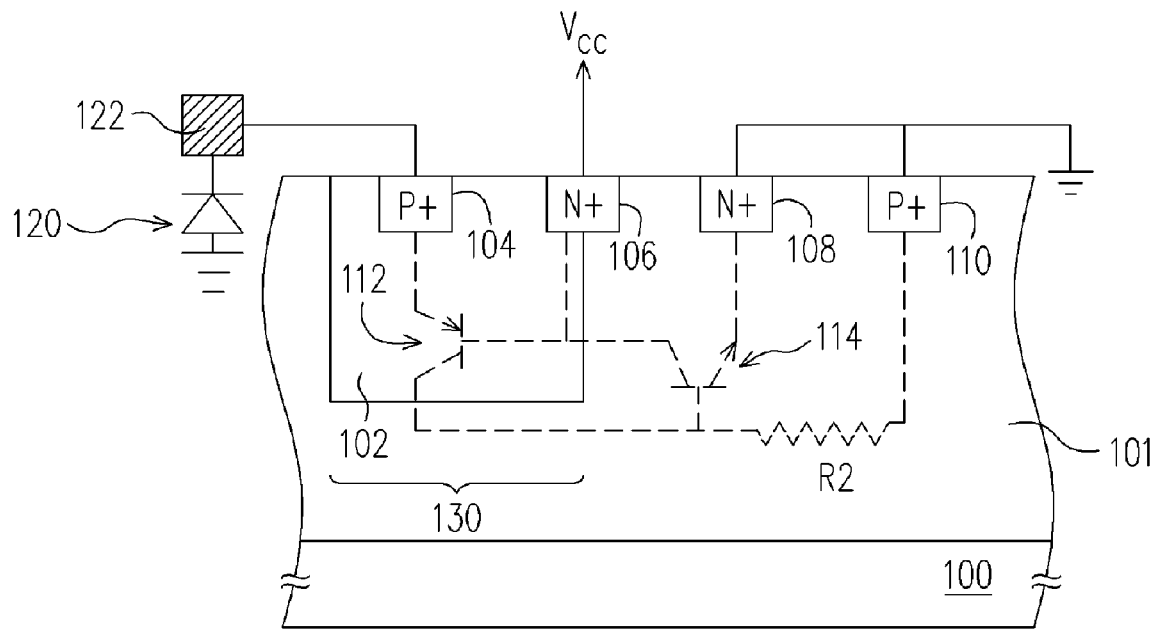
FIG. 3 is a cross-sectional schematic drawing of an ESD protection circuit according to a third embodiment of the present invention.

FIG. 3 is a cross-sectional schematic drawing of an ESD protection circuit according to a third embodiment of the present invention. Referring to FIG. 3, the N+ doped region 106 is formed in the substrate 100, wherein a part of the N+ doped region 106 is formed in the N well 102 and another part of the N+ doped region 106 is formed in the P deep well 101.

In this embodiment of the present invention, when the device is under normal operation, the Vcc is in on-state. The N+ doped region 106 serves as a guard ring and prevents latch-up effect. When the input pad 122 is being attacked by an electrostatic pulse, the Vcc is in off-state. Compared with the breakdown voltage, which is about 20-30V at the interface of the N well 102 and the P deep well 101 in FIG. 2A, the breakdown voltage at the interface of the N+ doped region and the P deep well 101 is about 10-15V. Therefore the breakdown voltage in this embodiment is much smaller. Accordingly, the ESD protection circuit of the present invention is capable of discharging electrostatic pulse.

Figure 4:
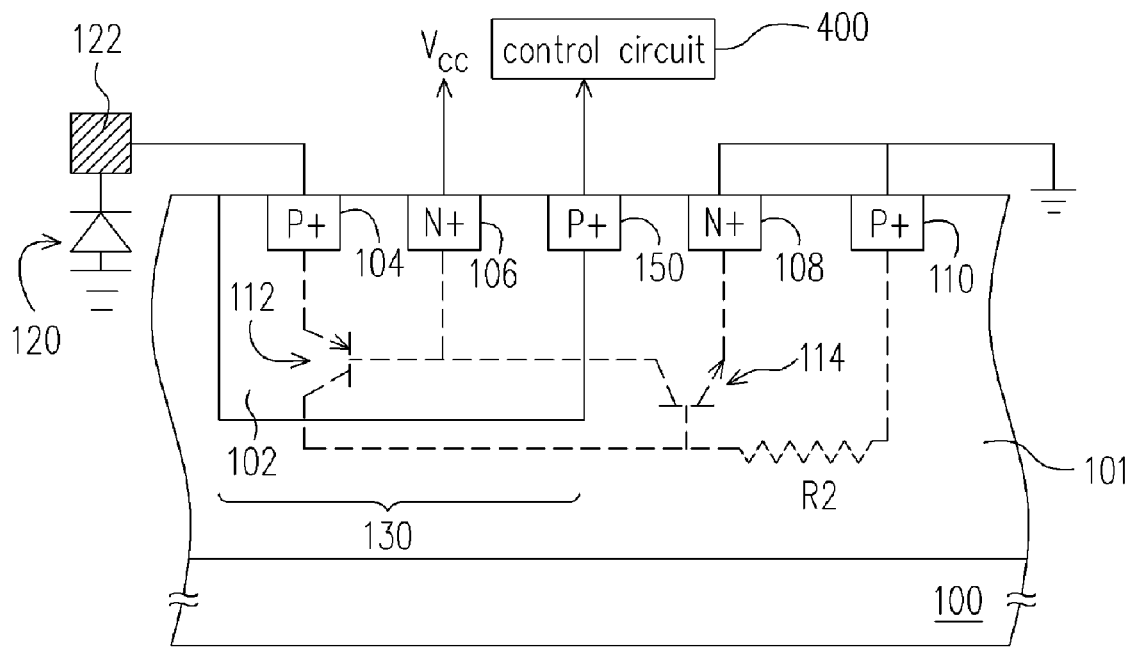
FIG. 4 is a cross-sectional schematic drawing of an ESD protection circuit according to a fourth embodiment of the present invention.

FIG. 4 is a cross-sectional schematic drawing of an ESD protection circuit according to a fourth embodiment of the present invention. Referring to FIG. 4, a P+ doped region 150 is formed in the N well 102 of the structure of FIG. 2A. In this embodiment, the P+ doped region 150 is partially formed in the N well 102 and in the P deep well 101. In the present embodiment of the present invention, the P+ doped region 150 is coupled to a control circuit 400 to ground the P+ doped region 150 when the device is under normal operation; and the P+ doped region 150 is floated when the input pad 122 is subjected to an electrostatic pulse.

Figure 5:
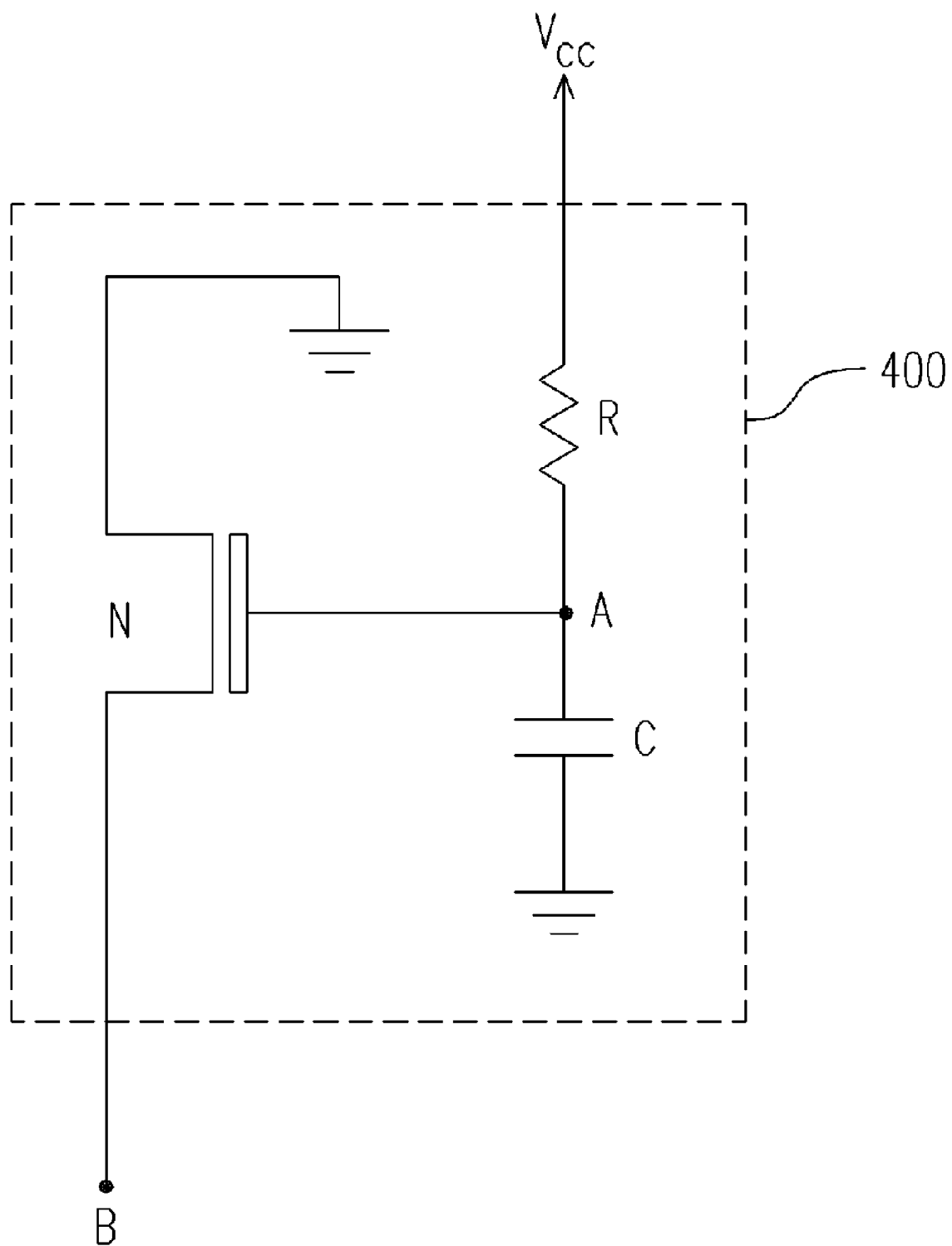
FIG. 5 is a schematic circuit drawing of a control circuit according to an embodiment of the present invention.

FIG. 5 is a schematic circuit drawing of an embodiment of the control circuit 400 according to an embodiment of the present invention. Referring to FIG. 5, the point B is coupled to the P+ doped region 150. The control circuit 400 comprises an NMOS transistor N, a resistor R and a capacitor C. When the device is under normal operation, the Vcc is in on-state. The point A has a relatively high voltage so as to turn on the NMOS transistor N. The point B has a relatively low voltage so that the P+ doped region 150 is grounded. When the input pad 122 is subject to an electrostatic current, the Vcc is floated or has a low voltage. The NMOS transistor N is turned off and the point A has a low voltage. Accordingly, the point B is floated and the P+ doped region 150 is not grounded.

The resistor R and the capacitor C constitute a delay circuit. When an electrostatic pulse flows into the control circuit 400, the delay circuit delays the electrostatic pulse from arriving at the point A and the electrostatic pulse is discharged with sufficient time.

In the embodiment described with reference to FIG. 4, when the device is under normal operation, the Vcc is in on-state. The P+ doped region 150 attracts holes and suppresses the formation of the SCR. As a result, the latch-up effect can be eliminated.

When devices in FIG. 4 are subject to an electrostatic pulse, the Vcc is in off-state, and the P+ doped region 150 is floated. Compared with the breakdown voltage, which is about 20-30V at the interface of the P deep well 101 and the N well 102 in FIG. 2A, the breakdown voltage at the interface of the P+ doped region 150 and the N well 102 in this embodiment is about 10-15V, which is comparatively much smaller. Therefore, the SCR of FIG. 4 can be easily turned on compared to that of FIG. 2 and performs the function of discharging electrostatic pulse more efficiently.

Figure 6:
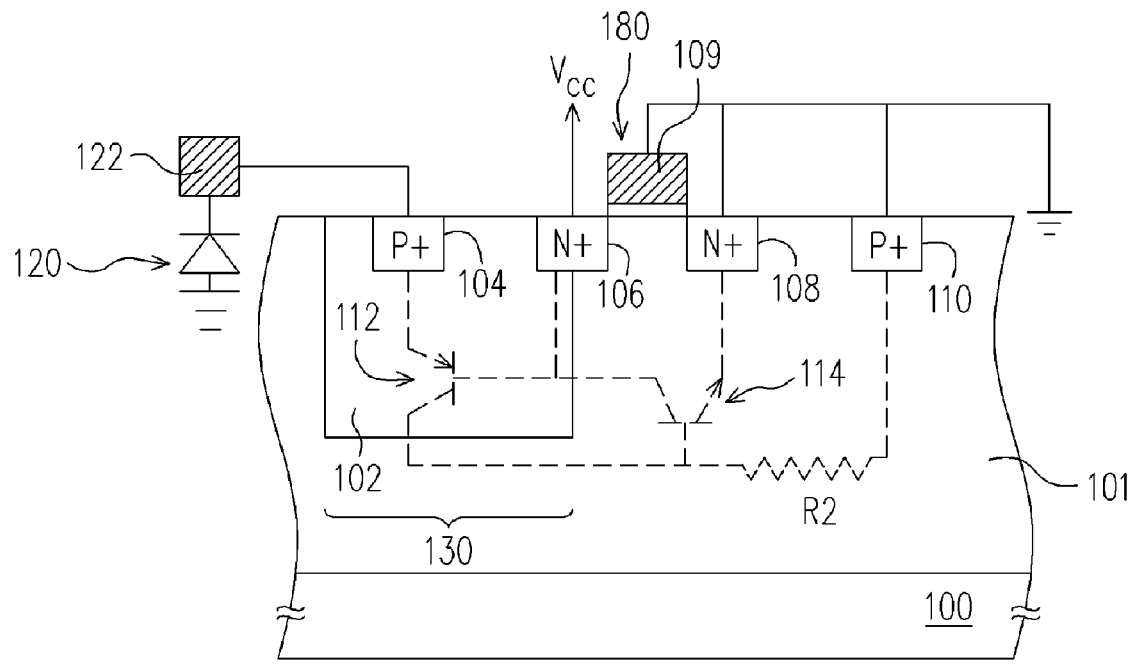
FIG. 6 is a cross-sectional schematic drawing of an ESD protection circuit according to a fifth embodiment of the present invention.

FIG. 6 is a cross-sectional schematic drawing of an ESD protection circuit according to a fifth embodiment of the present invention. Referring to FIG. 6, the exemplary ESD protection circuit of the present invention is coupled to an input pad 122. The ESD protection circuit comprises a diode 120, a first type deep well 101, a second type well 102, a first doped region of first type 104, a transistor 180 and a second doped region of first type 110.

The diode 120 is formed in the substrate 100, which is composed of an N well, a P+ doped region formed in the N well and an N+ doped region. In this embodiment, a terminal of the diode 120 is coupled to the input pad 122, and another terminal of the diode 120 is grounded.

According to this embodiment, the first type deep well 101 can be, for example, a P deep well. The second type well 102 can be, for example, an N well. The first doped region of first type 104 can be, for example, a P+ doped region. The transistor 180 can be, for example, an NMOS transistor. The second doped region of first type 110 can be, for example, a P+ doped region.

The P+ doped region 104 is formed in the N well 102. In this embodiment, the P+ doped region 104 is coupled to the input pad 122. The P+ doped region 110 is formed in the P deep well 101. The P+ doped region 110 is grounded. The NMOS transistor 180 is formed on the substrate 100. The NMOS transistor 180 comprises a gate 109, a drain 106 and a source 108. The drain 106 of the NMOS transistor 180 is coupled to the Vcc, and the gate 109 and the source 108 are grounded. In an embodiment, the drain 106 of the NMOS transistor 180 is partially formed in the N well 102 and in the P deep well 101.

The N well 102, the P+ doped region 104 formed in the N well 102 and the drain region 106 constitute another diode 130. A terminal of the diode 130 is coupled to the input pad 122 and another terminal of the diode 130 is coupled to the Vcc.

When the device is under normal operation, the Vcc is in on-state. The drain 106 of the transistor 180 serves as a guard ring and eliminates latch-up effect.

When the input pad 122 is attacked by an electrostatic pulse, the Vcc is in off-state. The electrostatic pulse flows into the input pad 122 and triggers the ESD protection circuit. As shown in FIG. 6, the P+ doped region 104, the N well 102 and the P deep well 101 constitute a PNP parasitic bipolar transistor 112. The N well 102, the P deep well 101 and the source 108 constitute an NPN parasitic bipolar transistor 114, wherein R2 represents the resistance of the P deep well. Specially, the base of the PNP parasitic bipolar transistor 112 is coupled to the collector of the NPN parasitic bipolar transistor 114; the collector of the PNP parasitic bipolar transistor 112 is coupled to the base of the NPN parasitic bipolar transistor 114. In other words, the base of the parasitic bipolar transistor is triggered by the collector of the other parasitic bipolar transistor. As a result, a positive feedback loop is formed. The PNPN structure formed constitute a SCR.

The ESD protection circuit of this embodiment is similar to that of FIG. 3 except for the gate 109 being formed on the substrate 100. The gate 109 and the N+ doped regions 106 and 108 adjacent thereto constitute an NMOS transistor. The area for the ESD protection circuit in FIG. 6 is similar to that in FIG. 3, and therefore the area of the ESD protection circuit of this embodiment is smaller compared to the traditional ESD protection circuit.

The ESD protection circuit of the present invention in FIG. 6 comprises the NMOS transistor 180. Usually, when the gate of an NMOS transistor is grounded, the gated breakdown voltage of the NMOS transistor is lower than 7-8V, which is smaller than the junction breakdown voltage of a diode. When the input pad 122 is subjected to an electrostatic pulse, the performance of SCR is enhanced for discharging the electrostatic pulse.

Figure 7:
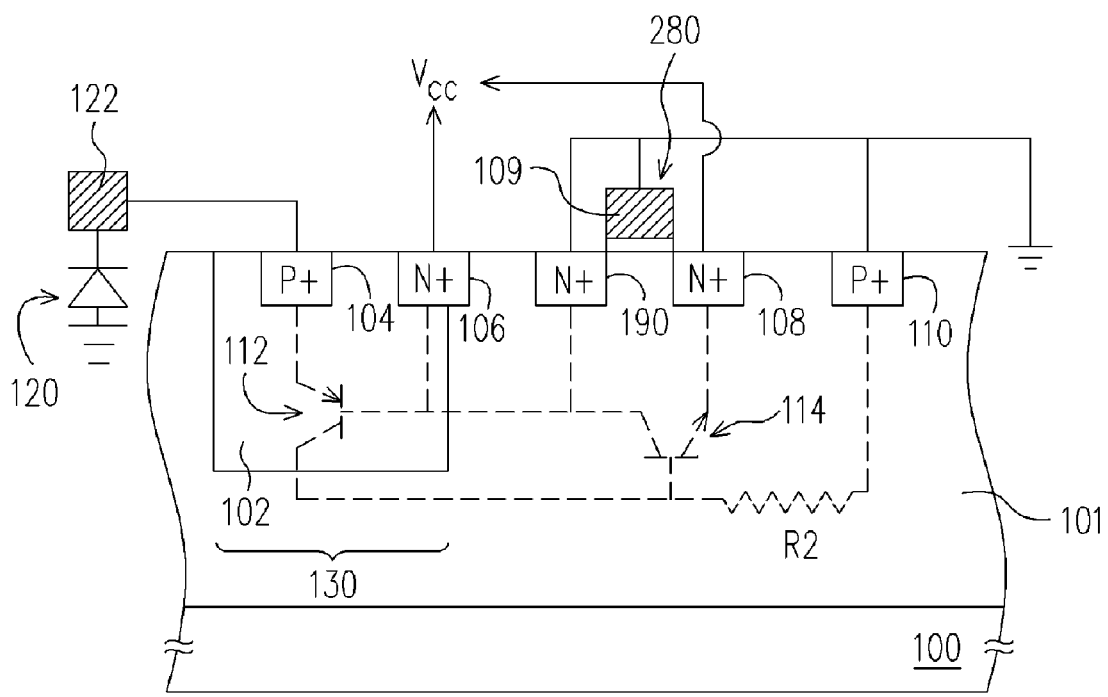
FIG. 7 is a cross-sectional schematic drawing of an ESD protection circuit according to a sixth embodiment of the present invention.

FIG. 7 is a cross-sectional schematic drawing of an ESD protection circuit according to a sixth embodiment of the present invention. The ESD protection circuit in FIG. 7 is similar to that in FIG. 3 except for an NMOS transistor 280 being formed on the substrate 100. The NMOS transistor 280 comprises a gate 109, a source 190 and a drain 108. The drain 108 of the NMOS transistor 280 is coupled to the Vcc. The source 190 and the gate 109 of the NMOS transistor 280 are grounded.

The structure of the NMOS transistor 280 of the ESD protection circuit in FIG. 7 is similar to that in FIG. 6 and therefore detailed descriptions thereof are not repeated.

In summary, the ESD protection circuit of the present invention is smaller in size occupying smaller area compared to the traditional ESD protection circuit, and therefore the loading effect resulting from the parasitic capacitance can be substantially reduced. Therefore, the ESD protection circuit of the present invention can be applied to devices with high-speed or high-voltage input pads.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. An electrostatic discharge (ESD) protection circuit coupled to an input pad, comprising:
   a diode, formed in a substrate, wherein the diode is coupled to the input pad;
   a first type deep well, formed in the substrate;
   a second type well, formed in the first type deep well;
   a first doped region of first type, formed in the second type well and coupled to the input pad;
   a second doped region of second type, formed in the second type well and coupled to a power supply voltage (Vcc);
   a third doped region of second type, formed in the first type deep well; and
   a fourth doped region of first type, formed in the first type deep well.

2. The ESD protection circuit of claim 1, wherein a terminal of the diode is coupled to the input pad, and another terminal thereof is grounded.

3. The ESD protection circuit of claim 1, wherein the third doped region of second type and the fourth doped region of first type are grounded.

4. The ESD protection circuit of claim 1, wherein the second doped region of second type is formed between the first doped region of first type and the third doped region of second type.

5. The ESD protection circuit of claim 1, wherein a part of the second doped region of second type is formed in the second type well, and another part of the second doped region of second type is fanned in the first type deep well.

6. The ESD protection circuit of claim 4, further comprising a fifth doped region of first type partially formed in the second type well and partially formed in the first type deep well.

7. The ESD protection circuit of claim 6, wherein the fifth doped region of first type is coupled to a control circuit to determine whether or not to ground the fifth doped region of first type.

8. The ESD protection circuit of claim 1, wherein when the input pad receives an electrostatic current, the Vcc is in off-state; the first doped region of first type, the second type well and the first type deep well constitute a first parasitic bipolar transistor; the second type well, the first type deep well and the third doped region of second type constitute a second parasitic bipolar transistor; and the first parasitic bipolar transistor and the second parasitic bipolar transistor constitute a feedback loop.

9. The ESD protection circuit of claim 1, wherein the first type is P type, and the second type is N type.

* * * * *